(12) United States Patent
Jun et al.

(10) Patent No.: US 12,007,514 B2
(45) Date of Patent: Jun. 11, 2024

(54) DYNAMIC X-RAY DETECTING PANEL, X-RAY DETECTOR HAVING THE SAME, AND METHOD OF DRIVING X-RAY DETECTOR

(71) Applicant: BIOSENSTECH INC, Yongin (KR)

(72) Inventors: Seung Ik Jun, Frisco, TX (US); Han Bin Jang, Hwaseong (KR); Jae Hoon Choi, Seongnam (KR)

(73) Assignee: BIOSENSTECH INC, Yongin (KR)

( * ) Notice: Subject to any disclaimer, the term of this patent is extended or adjusted under 35 U.S.C. 154(b) by 157 days.

(21) Appl. No.: 17/512,300

(22) Filed: Oct. 27, 2021

(65) Prior Publication Data

US 2023/0082187 A1 Mar. 16, 2023

(30) Foreign Application Priority Data

Sep. 14, 2021 (KR) .................... 10-2021-0122648

(51) Int. Cl.
*G01T 1/24* (2006.01)
*H01L 27/146* (2006.01)
*H01L 31/115* (2006.01)

(52) U.S. Cl.
CPC ........ *G01T 1/247* (2013.01); *H01L 27/14658* (2013.01); *H01L 27/14692* (2013.01); *H01L 31/115* (2013.01)

(58) Field of Classification Search
None
See application file for complete search history.

(56) References Cited

U.S. PATENT DOCUMENTS

| 2001/0038075 A1 | 11/2001 | Morishita |
| 2006/0077308 A1* | 4/2006 | Mochizuki ........ H01L 27/14663 348/800 |
| 2010/0134480 A1 | 6/2010 | Uchiyama |
| 2014/0054466 A1 | 2/2014 | Kurokawa et al. |

FOREIGN PATENT DOCUMENTS

| JP | 2003-218339 A | 7/2003 |
| JP | 2006-128644 A | 5/2006 |
| KR | 10-2011-0080052 A | 7/2011 |
| KR | 10-2016-0025397 A | 3/2016 |
| KR | 10-2019-0070587 A | 6/2019 |

OTHER PUBLICATIONS

The Extended European Search Report for European Patent Application No. 22208843.7, dated May 23, 2023.
The Notice of Reasons for Refusal for Japanese Patent Application No. 2021-189205, dated Jun. 6, 2023.

* cited by examiner

*Primary Examiner* — Edwin C Gunberg

(57) ABSTRACT

A dynamic X-ray detecting panel, an X-ray detector including the same, and a method of driving an X-ray detector are disclosed. The method of driving the X-ray detector is a method of driving a dynamic X-ray detector including the X-ray detecting panel. The X-ray detecting panel includes multiple pixels arranged in a matrix, each of the pixels includes a readout thin film transistor, a reset thin film transistor, and a photodiode, and line reset, window time, and readout proceed with respect to the multiple pixels in each row.

9 Claims, 5 Drawing Sheets

DYNAMIC X-RAY DETECTING PANEL, X-RAY DETECTOR HAVING THE SAME, AND METHOD OF DRIVING X-RAY DETECTOR

CROSS-REFERENCE TO RELATED APPLICATION

This patent document claims priority to and the benefit of Korean Patent Application No. 10-2021-0122648, filed on Sep. 14, 2021, the entire disclosure of which is incorporated by reference for all purposes as if fully set forth herein.

FIELD

Embodiment of the present invention is related to an X-ray detecting panel, an X-ray detector including the same, and a method of driving an X-ray detector, and more particularly to a high frame rate dynamic X-ray detecting panel, an X-ray detector including the same, and a method of driving the X-ray detector.

BACKGROUND

An X-ray detector is used not only in medical equipment for X-ray diagnostic imaging in hospitals and dental clinics, but also for internal defect inspection of electric vehicle batteries, semiconductors, electronic components, construction, aviation, ships, and the like, for industrial equipment for inspecting loading and unloading goods at airports and port facilities, and in military equipment for detecting dangerous substances, such as explosives and the like.

Dynamic X-ray detectors are used in medical and industrial imaging systems and the use of dynamic X-ray detectors for industrial purposes is growing specifically in non-destructive testing that is essential for product reliability, such as electric vehicle batteries or semiconductors. For medical purposes, dynamic X-ray detectors are used in, for example, C-arm CT, cone beam CT, breast cancer diagnosis CT, and the like.

Dynamic X-ray detectors are required to have a high frame rate, low image lag, and low ghost image in order to realize high frame rate images.

The X-ray detector includes an X-ray detecting panel, which is a dynamic imaging sensor. The X-ray detecting panel may detect visible light through a scintillator by converting X-ray to visible light.

FIG. 1 is a schematic layout diagram of an X-ray detecting panel of a conventional dynamic X-ray detector.

Referring to FIG. 1, a conventional X-ray detecting panel includes a plurality of pixels N, N+1, N+2, . . . , each Nth pixel of which includes a readout thin film transistor (TFT) and a photodiode.

In the thin film transistor, a readout terminal, that is, a drain, is connected to a readout IC through a readout pad and a gate is connected to a gate IC through a gate pad.

The photodiode is connected to a bias terminal through a bias pad.

FIG. 2 is a schematic diagram illustrating switching operation of the readout thin film transistor in the conventional X-ray detecting panel and FIG. 3 is a schematic diagram illustrating drive timing of the conventional X-ray detecting panel.

First, referring to FIG. 2, the conventional X-ray detecting panel obtains image data through sequential steps of global reset, window time and readout. The readout TFT is switched on upon global reset, switched off in window time, and switched on in the readout step.

Referring to FIG. 3, the global reset proceeds for a predetermined period of time at once for all lines, the window time also proceeds at once for all lines, and the readout step sequentially proceeds for each line. In this method, time delay occurs in each line between the window time and the readout step, thereby causing image lag and ghost image upon implementation of dynamic X-ray images. Accordingly, a method of driving the conventional X-ray detector is not suitable for a dynamic X-ray detector which is required to have a high frame rate.

SUMMARY

Embodiments of the present invention provide a dynamic X-ray detecting panel capable of preventing time delay in each line between window time and readout, a dynamic X-ray detector including the same, and a method of driving the X-ray detector.

In addition, embodiments of the present invention provide a dynamic X-ray detecting panel suitable for acquisition of a high frame rate X-ray images, a dynamic X-ray detector including the same, and a method of driving the X-ray detector.

In accordance with one aspect of the present invention, there is provided a method of driving a dynamic X-ray detector. The dynamic X-ray detector driving method is a method of driving a dynamic X-ray detector including an X-ray detecting panel. The X-ray detecting panel includes multiple pixels arranged in a matrix, in which each of the pixels includes a readout thin film transistor, a reset thin film transistor, and a photodiode, and line reset, window time and readout proceed with respect to the multiple pixels in each row.

In one embodiment, start of window time of a subsequent row may be later than start of window time of a previous row and readout of the pixels in the subsequent row may be performed after completion of readout of the pixels in the previous row.

Further, completion of readout of the previous row may coincide with completion of the window time of the subsequent row.

Further, a reset time may be longer than a readout time and an idle time may be defined after completion of the readout time. The idle time may correspond to a difference between the reset time and the readout time.

In one embodiment, line reset of the subsequent row may start after completion of line reset of the previous row.

Further, a reset time may be shorter than a readout time and an idle time may be defined after completion of the reset time. The idle time may correspond to a difference between the reset time and the readout time.

In another embodiment, line reset of the subsequent row may be performed before line reset of the previous row is completed, and line reset of the subsequent row may be completed a predetermined period of time after completion of line reset of the previous row.

In one embodiment, each of a reset time, the window time, and a readout time may be identically defined with respect to the pixels of all rows in the detecting panel.

In one embodiment, upon line reset, the reset thin film transistors of a corresponding row may be in an ON state and the readout thin film transistors thereof may be in an OFF state; during the window time, the reset thin film transistors of a corresponding row may be in an OFF state and the readout thin film transistors thereof may be in an OFF state;

and upon readout, the reset thin film transistors of a corresponding row may be in an OFF state and the readout thin film transistors thereof may be in an ON state.

Furthermore, gates of the readout thin film transistors in the pixels of each row may be commonly connected to one readout gate pad; drains of the readout thin film transistors in the pixels of each row may be connected to different readout pads, respectively; gates of the reset thin film transistors in the pixels of each row may be commonly connected to one reset gate pad; drains of the reset thin film transistors in the multiple pixels may be commonly connected to a reset drain pad; and the photodiode in each of the pixels may be commonly connected to sources of the reset thin film transistor and the readout thin film transistor therein.

In accordance with another aspect of the present invention, a dynamic X-ray detecting panel may include: multiple pixels arranged in a matrix and each including a readout thin film transistor, a reset thin film transistor, and a photodiode; multiple readout gate pads each commonly connected to gates of the readout thin film transistors in the pixels of one row; readout pads connected to drains of the readout thin film transistors in the pixels of one row, respectively; multiple reset gate pads each commonly connected to gates of the reset thin film transistors in the pixels of each row; and at least one reset drain pad commonly connected to drains of the reset thin film transistors in the multiple pixels, wherein the photodiode in each of the pixels is commonly connected to sources of the reset thin film transistor and the readout thin film transistor therein.

The dynamic X-ray detecting panel may further include a bias pad commonly connected to anodes (positive terminals) of the photodiodes in the multiple pixels.

The readout pads may be commonly connected to the readout thin film transistors in the pixels of each column.

The dynamic X-ray detecting panel may include multiple reset drain pads each commonly connected to the drains of the reset thin film transistors in the multiple pixels, the multiple reset drain pads being positioned at upper and lower places and/or at right and left places in the detecting panel.

In accordance with a further aspect of the present invention, there is provided a dynamic X-ray detector including the dynamic X-ray detecting panel set forth above.

The dynamic X-ray detector may further include a readout gate IC connected to the readout gate pads; a readout IC connected to the readout pads; and a reset gate IC connected to the reset gate pads.

According to the embodiments of the present invention, the dynamic X-ray detecting panel and an X-ray detector including the same can prevent time delay in each line between window time and readout. In addition, the method of driving an X-ray detector is suitable for acquisition of high frame rate X-ray images.

DRAWINGS

DETAILED DESCRIPTION

Figure 1:
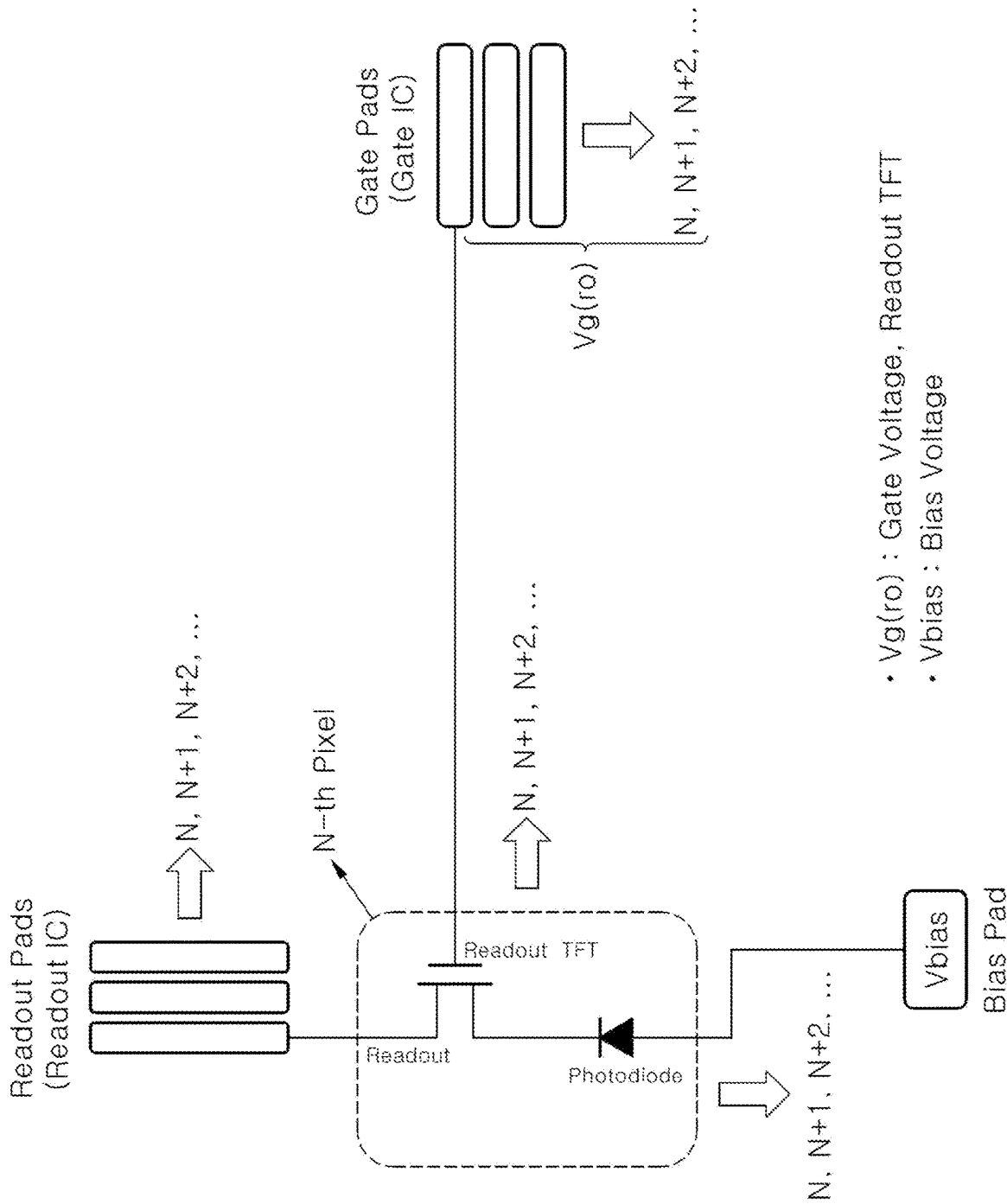
FIG. 1 is a schematic layout diagram of an X-ray detecting panel of a conventional dynamic X-ray detector.
Figure 2:
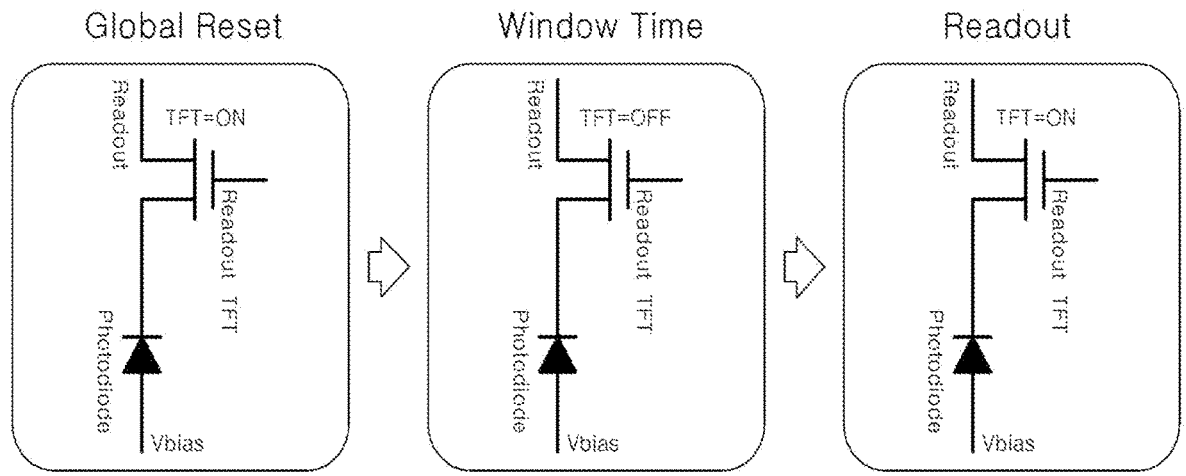
FIG. 2 is a schematic diagram illustrating switching operation of a readout thin film transistor in the conventional X-ray detecting panel.
Figure 3:
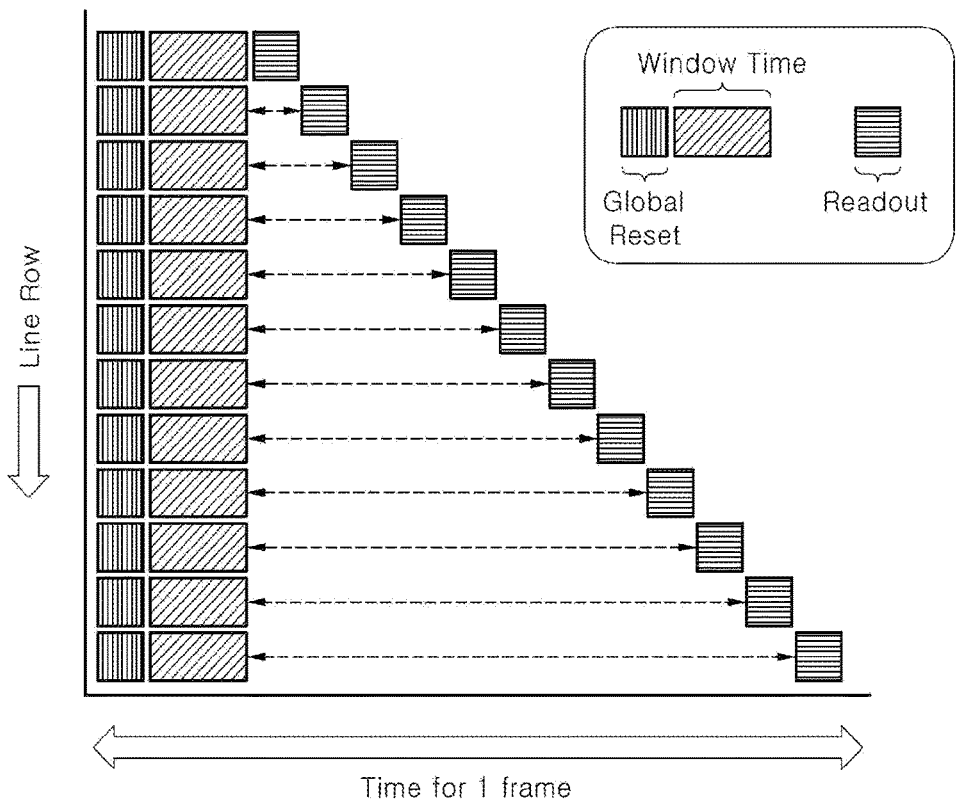
FIG. 3 is a schematic diagram illustrating drive timing of the conventional X-ray detecting panel.

Hereinafter, embodiments of the present invention will be described with reference to the accompanying drawings. It should be understood that the following embodiments are provided for complete disclosure and thorough understanding of the invention by those skilled in the art. Therefore, the present invention is not limited to the following embodiments and may be embodied in different ways. It should be noted that the drawings are not to precise scale and may be exaggerated in width, length, and thickness of components for descriptive convenience and clarity only. It will be understood that, when an element is referred to as being placed "above" or "on" another element, it can be directly placed above or on the other element, or intervening element(s) may also be present therebetween. The same components will be denoted by the same reference numerals and like components will be denoted by like reference numerals throughout the specification.

Figure 4:
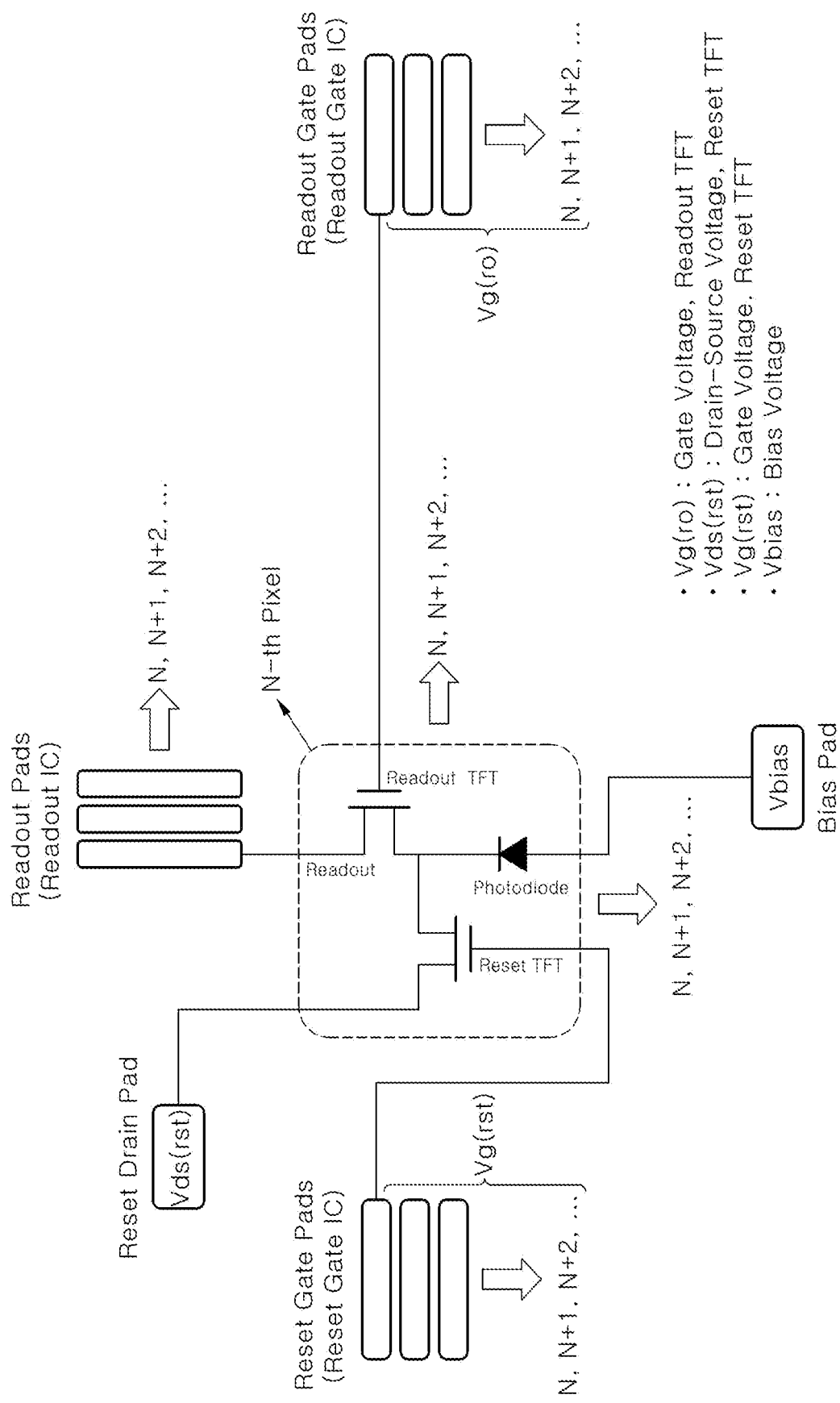
FIG. 4 is a schematic layout diagram of an X-ray detecting panel of a dynamic X-ray detector according to one embodiment of the present invention.

FIG. 4 is a schematic layout diagram of an X-ray detecting panel of a dynamic X-ray detector according to one embodiment of the present invention. Herein, the X-ray detecting panel is suitable for indirect detection in which detecting visible light converted by a scintillator. However, it should be understood that the present invention is not limited thereto and may be applied to a direct detection type X-ray detecting panel for directly detecting X-rays.

Referring to FIG. 4, the X-ray detecting panel includes multiple pixels N, N+1, N+2, . . . , and each pixel (N-th Pixel) includes a readout thin film transistor (readout TFT), a reset thin film transistor (reset TFT), and a photodiode. In addition, the X-ray detecting panel may include readout pads, readout gate pads, reset gate pads, a reset drain pad, and a bias pad.

The multiple pixels may be arranged in a matrix, but are not limited thereto. For example, the multiple pixels may include pixels arranged in 5,000×5,000 columns and rows.

Each of the readout TFT and the reset TFT may be a switching device including non-crystalline silicon, an oxide of at least one of In—Ga—Zn—O, or polycrystalline silicon as a semiconductor layer. The photodiode may be a device including non-crystalline silicon, an oxide of at least one of In—Ga—Zn—O, polycrystalline silicon, or an organic compound as a light to electric conversion layer.

First, for example, a connection structure of the readout TFT, the reset TFT, and the photodiode in an $N^{th}$ pixel will be described.

A readout terminal of the readout TFT, that is, a drain of the readout TFT, is connected to a readout IC through the readout pad, and a gate thereof is connected to a readout gate IC through the readout gate pad.

A drain of the reset TFT is connected to a drain source voltage terminal Vds (rst) through the reset drain pad and a gate thereof is connected to a reset gate IC through the reset gate pad.

The photodiode is connected to a bias voltage terminal Vbias through the bias pad. An anode of the photodiode may be connected to the bias pad and a cathode thereof may be connected to sources of the readout TFT and the reset TFT. Alternatively, the cathode of the photodiode may be connected to the bias pad and the anode thereof may be connected to the sources of the readout TFT and the reset TFT.

Each of the bias pad and the reset drain pad may be commonly connected to all of the multiple pixels N, N+1, N+2, . . . . That is, all of the multiple photodiodes in the detecting panel may be commonly connected to one bias pad and drains of the multiple reset TFTs may be commonly connected to one reset drain pad. In this embodiment, each of the bias pad and the reset drain pad is provided singularly. Alternatively, the detecting panel may be provided with multiple bias pads and multiple reset drain pads. Each of the bias pads may be commonly connected to the multiple photodiodes in the detecting panel and each of the reset drain pads may be commonly connected to drains of the multiple reset TFTs in the detecting panel. The multiple reset drain pads may be positioned at upper and lower places and/or at right and left places in the detecting panel. This arrangement of the multiple reset drain pads can reduce a connection length between the reset drain pad and the pixel, thereby reducing RC delay.

On the other hand, the pixels arranged in the same row may be commonly connected to one readout gate pad and one reset gate pad, and the pixels arranged in different rows may be connected to different readout gate pads and different reset gate pads. That is, gates of the readout TFTs in the pixels arranged in the same row may be commonly connected to one readout gate pad and gates of the readout TFTs in the pixels arranged in different rows are connected to different readout gate pads. Further, gates of the reset TFTs in the pixels arranged in the same row may be commonly connected to one reset gate pad and gates of the reset TFTs in the pixels arranged in different rows are connected to different reset gate pads.

On the other hand, the pixels arranged in the same column may be commonly connected to one readout pad and the pixels arranged in different columns may be connected to different readout pads. That is, drains of the readout TFTs in the pixels arranged in the same column are commonly connected to one readout pad and drains of the readout TFTs in the pixels arranged in different columns are connected to different readout pads. Accordingly, the pixels arranged in one row are connected to different readout pads.

With this connection arrangement of the transistors and the photodiodes in the pixels arranged in a matrix, the detection panel allows easy reset and readout operation in each line, that is, in each row, thereby providing optimal image data for a high frame rate X-ray images.

Figure 5:
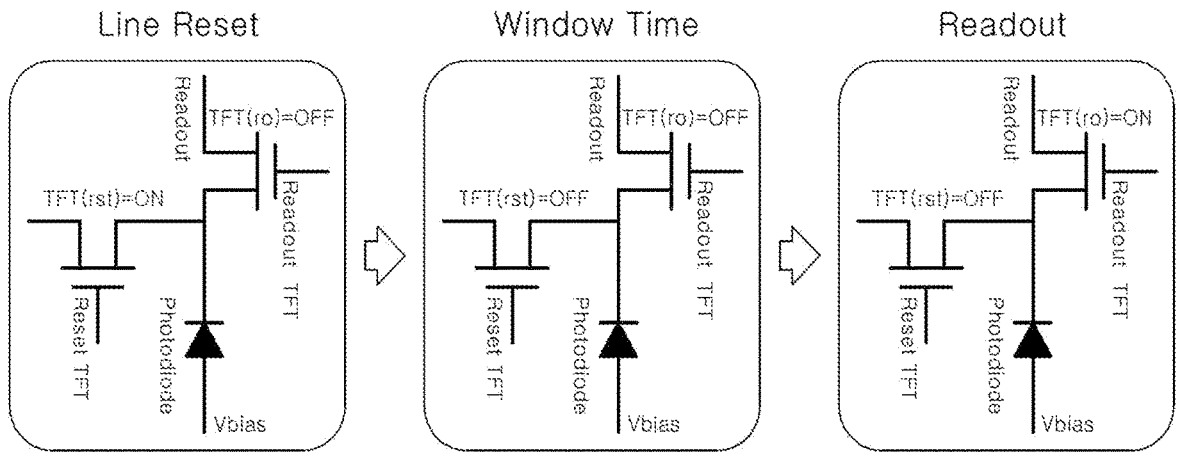
FIG. 5 is a schematic diagram illustrating switching operation of thin film transistors in the X-ray detecting panel according to the embodiment of the present invention.

FIG. 5 is a schematic diagram illustrating switching operation of the thin film transistors in the X-ray detecting panel according to the embodiment of the present invention.

Referring to FIG. 5, in this embodiment, in the pixels N, N+1, N+2, . . . , line reset may be performed line by line, that is, in each row.

Upon line reset, the reset TFT is switched on and the readout TFT is switched off. For example, gate voltage Vg (rst) is applied to the gate of the reset TFT by the reset gate IC to switch the reset TFT on and gate voltage Vg (ro) is applied to the gate of the readout TFT by the readout gate IC to switch the readout TFT off. For example, upon line reset, the gate voltage Vg (rst) of the reset TFT may be in the range of 0V to 30V, the drain-source voltage may be in the range of 0V to 20V, or the drain may be floated. In addition, the gate voltage Vg (ro) of the readout TFT may be in the range of 0V to −30V, the drain-source voltage may be in the range of 0V to 20V, or the drain may be floated. On the other hand, bias voltage Vbias may be applied to the photodiode. The bias voltage Vbias may be in the range of, for example, −10V to 10V.

By line reset, remaining charges in the pixels connected to the reset gate pad may be removed through the reset TFTs, whereby the pixel can be reset. When line reset with respect to one line (row) is completed, line reset with respect to a subsequent line may be performed. In this way, reset operation may be performed with respect to the pixels of each line in the X-ray detecting panel.

After reset is performed, window time proceeds to collect data generated by irradiation with X-rays. In this embodiment, the term "window time" means a time in which charges generated in the photodiode by irradiation with X-rays are saturated therein. The window time may be arbitrarily set in consideration of charge saturation times of the photodiodes.

For the window time, the reset TFT and the readout TFT are both switched off. For example, gate voltage Vg (rst) is applied to the gate of the reset TFT by the reset gate IC to switch the reset TFT off and gate voltage Vg (ro) is applied to the gate of the readout TFT by the readout gate IC to switch the readout TFT off. For example, for the window time, the gate voltage Vg (rst) of the reset TFT may be in the range of 0V to −30V, the drain-source voltage may be in the range of 0V to 20V, or the drain may be floated. In addition, the gate voltage Vg (ro) of the readout TFT may be in the range of 0V to −30V, the drain-source voltage may be in the range of 0V to 20V, or the drain may be floated. On the other hand, bias voltage Vbias may be applied to the photodiode. The bias voltage Vbias may be in the range of, for example, −10V to 10V.

By irradiation with X-rays, photoelectric transition occurs in the photodiode to generate charges therein. Since the readout TFT and the reset TFT are in an OFF state, the charges generated in the photodiode may be accumulated in the photodiode or in the source of the readout TFT.

In the readout step, the reset TFT is kept in a switched off state and the readout TFT is switched on. For example, the gate voltage Vg (rst) is applied to the gate of the reset TFT by the reset gate IC to allow the reset TFT to be kept in an OFF state and the gate voltage Vg (ro) is applied to the gate of the readout TFT by the readout gate IC to switch the readout TFT on. For example, in the readout step, the gate voltage Vg (rst) of the reset TFT may be in the range of 0V to −30V, the drain-source voltage may be in the range of 0V to 20V, or the drain may be floated. In addition, the gate voltage Vg (ro) of the readout TFT may be in the range of 0V to 30V, the drain-source voltage may be in the range of 0V to 20V, or the drain may be floated. On the other hand, bias voltage Vbias may be applied to the photodiode. The bias voltage Vbias may be in the range of, for example, −10V to 10V.

In the readout step, the charges generated in the photodiode move from the source of the readout TFT to the drain to be transferred to the readout IC through the readout pad. The readout IC may generate image data using data of the charges.

Line reset, window time, and readout sequentially proceed and data with respect to one line is processed by these steps. By sequentially processing the data in each line, one frame of data with respect to all pixels can be achieved. Dynamic images can be implemented by obtaining multiple frames of data through repetition of the process of processing the data for each line.

Figure 6:
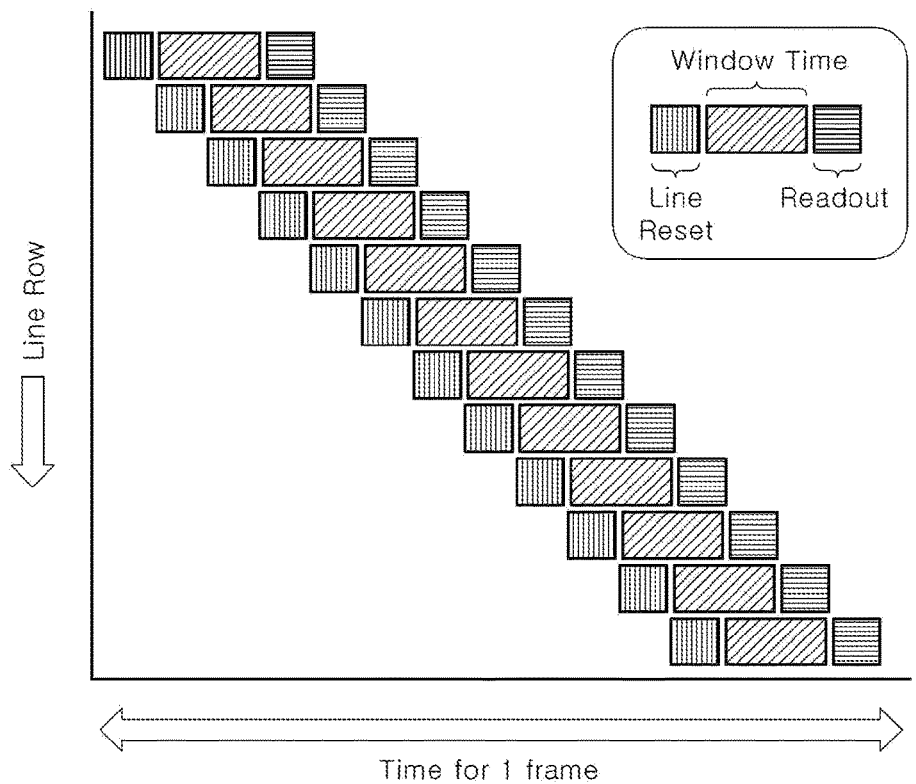
FIG. 6 is a schematic diagram illustrating drive timing of the X-ray detecting panel according to the embodiment of the present invention.

A method of performing line reset, window time, and readout for each line will be described in more detail with reference to FIG. 6. FIG. 6 is a schematic diagram illustrating drive timing of the X-ray detecting panel according to the embodiment of the present invention. FIG. 6 shows line reset, window time, and readout with respect to a first row.

Referring to FIG. 6, line reset, window time, and readout proceed for each line, as described with reference to FIG. 5. For example, line reset, window time, and readout proceed with respect to the first row. In order to reset the pixels in the first row, the reset TFTs in the pixels of the first row are switched on. Here, the reset TFTs in the pixels of the other rows may be in an OFF state, but are not limited thereto. For example, the pixels of the other rows may be reset together with the pixels in the first row.

Line reset with respect to the pixels of the first row is performed in order to remove charges remaining in the photodiodes and the source of the readout TFTs or charges due to parasitic capacitance. Line reset may be performed for a sufficient period of time to remove the remaining charges. For example, the period of time for line reset may be set in consideration of materials and capacities of the readout TFTs, the reset TFTs, and the photodiodes or may be set experimentally.

After line reset with respect to the first row is performed, the reset TFTs of the first row are switched off. On the other hand, the readout TFTs of the first row are kept in an OFF state. Accordingly, charges generated in the photodiodes by irradiation with X-rays are accumulated in the photodiodes and the source of the readout TFT. The charges may be saturated in the source of the readout TFT for window time.

After the window time, the readout TFTs of the first row are switched on. As a result, the charges accumulated in the photodiodes and the source of each of the readout TFTs in the first row are transferred to the readout IC through the drain of the readout TFT and the readout pad.

Readout with respect to the second row may be performed after completion of readout with respect to the first row and readout with respect to the third row may be performed after completion of readout with respect to the second row. Readout with respect to each row is completed through this process, thereby providing one frame of data. According to this embodiment, completion of readout of an immediately previous row may coincide with completion of window time of a subsequent row. In addition, start of window time of the previous row may coincide with start of reset time of the subsequent row.

In this embodiment, timing may be set to allow readout to be successively performed, whereby high frame rate dynamic imaging data can be achieved while reducing a time of one frame. However, it should be understood that the present invention is not limited thereto. For example, line reset or window time of the second row may start after completion of readout of the first row.

According to this embodiment, window time and readout sequentially proceed for each line, whereby time delay does not occur between the window time and readout. Accordingly, the X-ray detecting panel according to this embodiment can implement high frame rate dynamic imaging without generation of image delay or afterimage unlike a conventional X-ray detecting panel.

Figure 7:
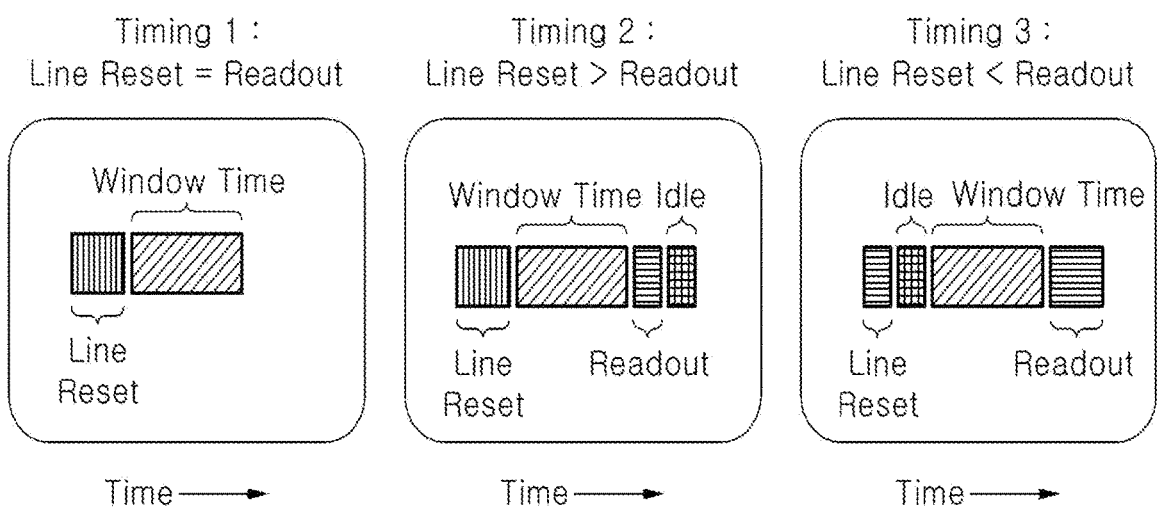
FIG. 7 is a schematic diagram illustrating optional drive timings of X-ray detecting panels according to various embodiments of the present invention.

FIG. 7 is a schematic diagram illustrating optional drive timings of X-ray detecting panels according to various embodiments of the present invention.

During irradiation with X-rays, each of the pixels accumulates data by switching the reset TFT and the readout TFT off. That is, during the window time, charges are accumulated in the photodiode and the source of the readout TFT. The window time is set to allow substantial saturation of the charges therein and is generally longer than a reset time or a readout time. On the other hand, the reset time may be the same as the readout time or may be different therefrom, and in each case, drive timing can be adjusted.

Referring to FIG. 7, timing 1 indicates the case where the reset time is the same as the readout time. When the reset time is the same as the readout time, completion of readout of a previous row may coincide with start of readout of a subsequent row, as described with reference to FIG. 6. Alternatively, completion of readout of the previous row may coincide with completion of window time of the subsequent row. Alternatively, completion of the reset time of the previous row or start of the window time of the previous row may coincide with start of the reset time of the subsequent row.

Timing 2 indicates the case where the reset time is longer than the readout time. In this case, line reset, window time, and readout are performed in the same way as in FIG. 6, and completion of readout of the previous row does not coincide with completion of the window time of the subsequent row. To compensate for this problem, an idle time may be defined. The idle time may be defined as a time corresponding to a difference between the reset time and the readout time. During the idle time, the readout TFT may be switched off.

Unlike Timing 2, Timing 3 indicates the case where the reset time is shorter than the readout time. In this case, readout of the subsequent row starts after completion of readout of the previous row, and start of the window time of the previous row does not coincide with start of reset of the subsequent row. To compensate for this problem, an idle time may be defined between the reset time and the window time. During the idle time, the reset TFT may be switched off.

According to this embodiment, even when the reset time does not coincide with the readout time, the idle time is positioned therebetween to optimize timing drive of the detecting panel.

Although reset of the subsequent row has been described as being started after completion of reset of the previous row, it should be understood that other implementations are possible. For example, reset of all rows may be simultaneously started. Here, completion of the reset time differs for each row, whereby readout can be performed without time delay after window time.

Although some embodiments have been described herein, it should be understood that these embodiments are not to be construed in any way as limiting the present invention. It should be understood that various modifications, variations, and alterations can be made by those skilled in the art without departing from the spirit and scope of the present invention.

What is claimed is:

1. A method of driving a dynamic X-ray detector including an X-ray detecting panel, wherein line reset, window time, and readout proceed in order for each frame time, row by row, with respect to multiple pixels in an active image area, each of the multiple pixels including a readout thin film transistor, a reset thin film transistor, and a photodiode, wherein each of a reset time, the window time, and a readout time is identically defined at all frame times with respect to pixels of all rows in the active image area, wherein start of line reset of a subsequent row is later than start of line reset of a previous row, and wherein a time interval between readout and line reset following the readout is longer than window time between line reset and readout following the line reset in each row.

2. The method of driving a dynamic X-ray detector according to claim 1, wherein start of window time of a subsequent row is later than start of window time of a previous row and readout of the pixels in the subsequent row is performed after completion of readout of the pixels in the previous row.

3. The method of driving a dynamic X-ray detector according to claim 2, wherein completion of readout of the previous row coincides with completion of the window time of the subsequent row.

4. The method of driving a dynamic X-ray detector according to claim 3, wherein a reset time is longer than a readout time and an idle time corresponding to a difference between the reset time and the readout time is defined after completion of the readout time.

5. The method of driving a dynamic X-ray detector according to claim 2, wherein line reset of the subsequent row starts after completion of line reset of the previous row.

6. The method of driving a dynamic X-ray detector according to claim 5, wherein a reset time is shorter than a readout time and an idle time corresponding to a difference between the reset time and the readout time is defined after completion of the reset time.

7. The method of driving a dynamic X-ray detector according to claim 2, wherein line reset of the subsequent row is performed before completion of line reset of the previous row and line reset of the subsequent row is completed a predetermined period of time after completion of line reset of the previous row.

8. The method of driving a dynamic X-ray detector according to claim 1, wherein:
upon line reset, the reset thin film transistors of a corresponding row are in an ON state and the readout thin film transistors thereof are in an OFF state;
during the window time, the reset thin film transistors of a corresponding row are in an OFF state and the readout thin film transistors thereof are in an OFF state; and
upon readout, the reset thin film transistors of a corresponding row are in an OFF state and the readout thin film transistors thereof are in an ON state.

9. The method of driving a dynamic X-ray detector according to claim 8, wherein:
gates of the readout thin film transistors in the pixels of each row are commonly connected to one readout gate pad;
drains of the readout thin film transistors in the pixels of each row are connected to different readout pads, respectively;
gates of the reset thin film transistors in the pixels of each row are commonly connected to one reset gate pad;
drains of the reset thin film transistors in the multiple pixels are commonly connected to a reset drain pad; and
the photodiode in each of the pixels is commonly connected to sources of the reset thin film transistor and the readout thin film transistor therein.

* * * * *